United States Patent
Kimura et al.

(10) Patent No.: US 7,584,315 B2
(45) Date of Patent: Sep. 1, 2009

(54) INTEGRATED CIRCUIT MONITORING AN INTERNAL SIGNAL CONVERTED FROM AN ANALOG INPUT SIGNAL

(75) Inventors: Naohiro Kimura, Uji (JP); Harumitsu Miyashita, Nara (JP); Takeshi Nakajima, Nara (JP); Hiromichi Ishibashi, Ibaraki (JP); Yoshikazu Yamamoto, Osaka (JP); Kohei Nakata, Osaka (JP)

(73) Assignee: Panasonic Corporation, Osaka (JP)

( * ) Notice: Subject to any disclaimer, the term of this patent is extended or adjusted under 35 U.S.C. 154(b) by 1235 days.

(21) Appl. No.: 10/818,568

(22) Filed: Apr. 6, 2004

(65) Prior Publication Data

US 2004/0205430 A1 Oct. 14, 2004

(30) Foreign Application Priority Data

Apr. 10, 2003 (JP) ............................. 2003-106389

(51) Int. Cl.
*G06F 13/12* (2006.01)
*G06F 3/00* (2006.01)
*G06F 13/00* (2006.01)
*G11B 7/085* (2006.01)

(52) U.S. Cl. ................... 710/69; 369/30.03; 710/33; 710/60; 710/62

(58) Field of Classification Search ............... 710/33, 710/60, 62, 69; 369/30.3
See application file for complete search history.

(56) References Cited

U.S. PATENT DOCUMENTS 6,151,641 A * 11/2000 Herbert .................... 710/22

2003/0135798 A1 * 7/2003 Katayama et al. .......... 714/710

FOREIGN PATENT DOCUMENTS

| JP | 08-086836 | 4/1996 |
|----|-----------|--------|
| JP | 11-016392 | 1/1999 |
| JP | 11-027260 | 1/1999 |
| JP | 11-510912 | 9/1999 |
| JP | 2000-215693 | 8/2000 |
| JP | 2001-228215 A | 8/2001 |
| JP | 2002-024201 | 1/2002 |
| JP | 2002-074996 | 3/2002 |
| WO | WO 97/47980 | 12/1997 |

* cited by examiner

*Primary Examiner*—Niketa I Patel
(74) *Attorney, Agent, or Firm*—Panitch Schwarze Belisario & Nadel LLP

(57) ABSTRACT

An integrated circuit includes: a signal processor, which receives an input signal and generates a processed signal, representing processing information obtained by subjecting the input signal to predetermined processing, and at least one type of internal signal including internal information obtained during the processing; at least one memory storing the processing information; an interface exchanges signals with an external device; and a controller controlling the signal processor, memory and interface. On receiving a first instruction from the external device through the interface, the controller controls the signal processor and memory such that the processing information is once stored in the memory and then output to the external device via the interface. In response to a second instruction, the controller controls the signal processor and memory such that the internal information is once stored in the memory and then output to the external device via the interface.

13 Claims, 6 Drawing Sheets

FIG.1    PRIOR ART
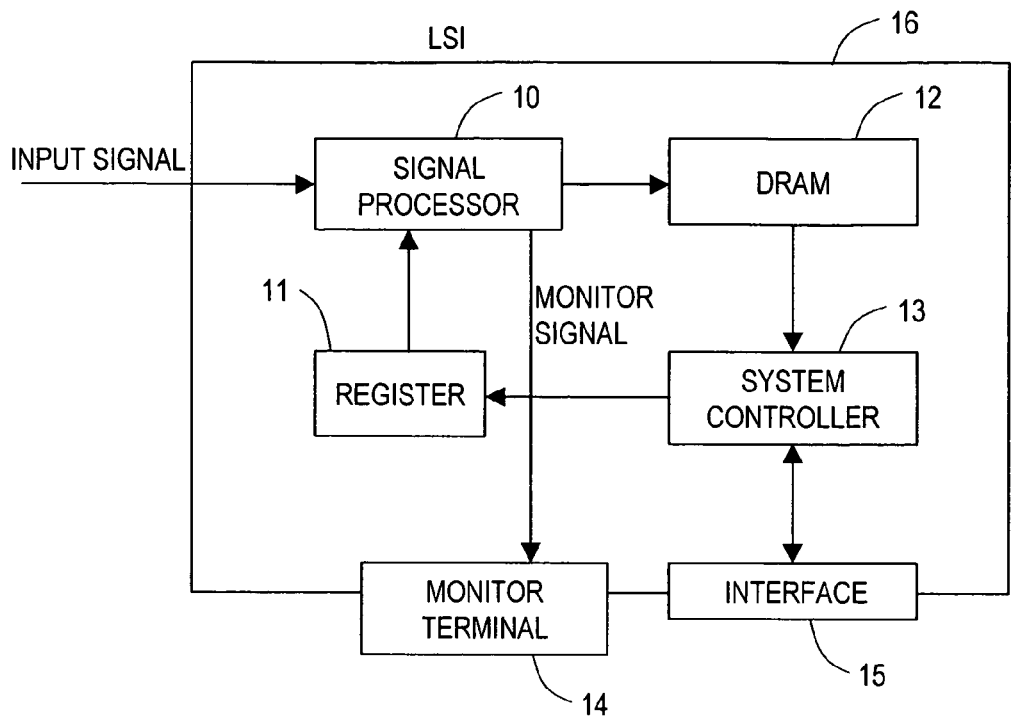
FIG.2    PRIOR ART
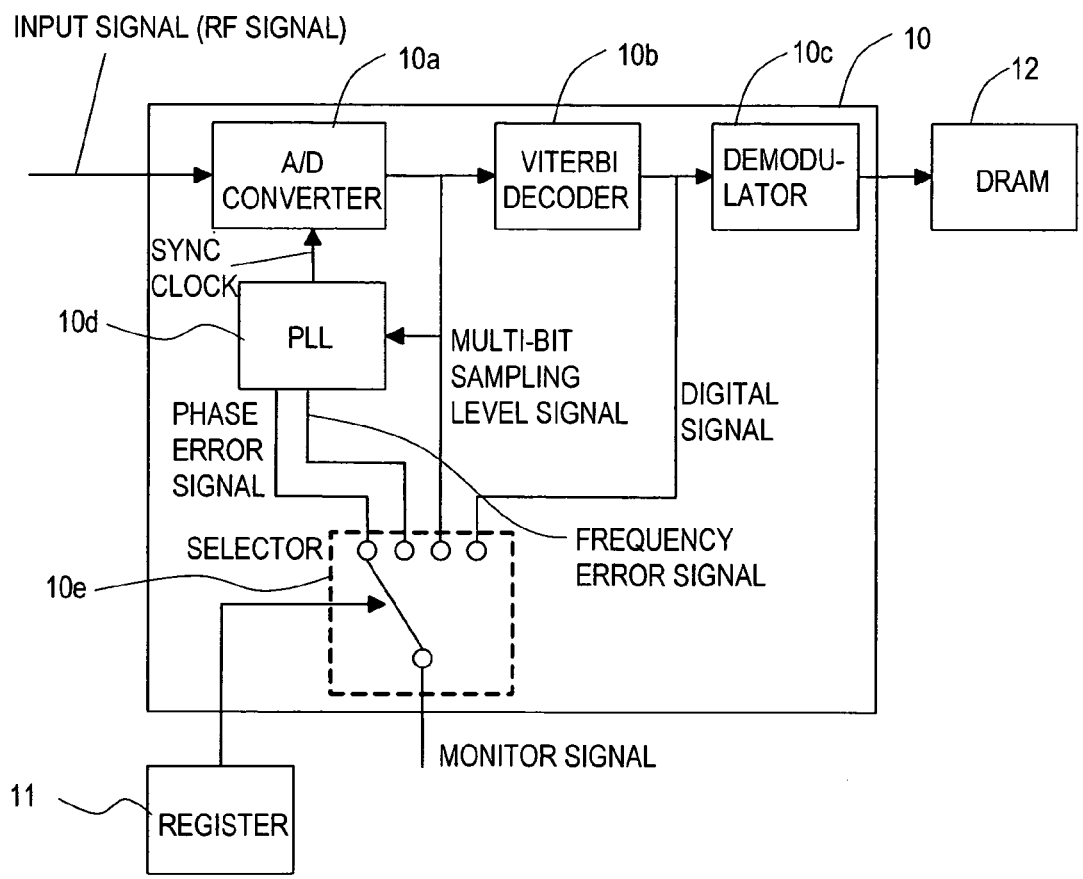

INTEGRATED CIRCUIT MONITORING AN INTERNAL SIGNAL CONVERTED FROM AN ANALOG INPUT SIGNAL

BACKGROUND OF THE INVENTION

1. Field of the Invention

The present invention relates to an integrated circuit that allows the user to monitor its internal signals.

2. Description of the Related Art

As information and communication technologies have been tremendously developing these days, it has become increasingly necessary to process a huge amount of information at a very high speed. To achieve this purpose, semiconductor integrated circuits for use in a data storage system or a communications system (e.g., multiple LSIs having the capability of processing analog and digital signals) are often combined together into a single semiconductor chip (which implementation will be referred to herein as a "single-chip LSI").

If multiple LSIs can be packaged in a single-chip LSI, then the number of electronic components needed to achieve their intended functions can be reduced significantly and the final circuit configuration can be simplified drastically, too. Also, if multiple functions to be usually achieved by a number of components in a single system can be carried out by such a single-chip LSI, then that system can be manufactured at a much lower cost. To further develop today's highly organized information processing networks, it is very important to provide such a system with those sophisticated functions.

However, when multiple LSIs are packaged in a single chip, those functional blocks are interconnected together inside of the single-chip LSI and various signals to be exchanged between those blocks cannot be easily monitored externally, thus making it difficult to evaluate the functional blocks or perform debugging. To overcome those problems, some conventional single-chip LSIs include a monitor terminal for monitoring internal signals.

FIG. 1 is a block diagram showing a configuration for a typical signal processing single-chip LSI. As shown in FIG. 1, the LSI 16 includes a signal processor 10, a register 11, a DRAM 12, a system controller 13, a monitor terminal 14 and an interface 15. The system controller 13 specifies some values determining how the signal processor 10 should operate and stores those settings in the register 11. In accordance with the settings specified in the register 11, the signal processor 10 processes a signal that has been input to this LSI 16 and then transfers resultant signal information to the DRAM 12. Also, the signal processor 10 outputs an internal signal, representing internal information generated while processing the input signal, as a monitor signal to the monitor terminal 14. In response, the monitor terminal 14 outputs the monitor signal, supplied from the signal processor 10, to a circuit outside of the LSI 16. The DRAM 12 stores the processing information that has been received from the signal processor 10. In response to a request that has been externally input through the interface 15, the system controller 13 retrieves the information from the DRAM 12 and outputs it to an outside component by way of the interface 15. Also, in accordance with an instruction that has been externally input through the interface 15, the system controller 13 defines the settings in the register 11. According to the settings specified in the register 11, the types of signals to be output by the signal processor 10 to the monitor terminal 14 may be selected among various internal signals.

FIG. 2 is a block diagram showing a detailed configuration for the signal processor 10 when the LSI 16 is used as a digital read channel for an optical disc drive. As shown in FIG. 2, the signal processor 10 includes an A/D converter 10a, a Viterbi decoder 10b, a demodulator 10c, a PLL 10d and a selector 10e. These functional blocks generate a phase error signal, a frequency error signal, a multi-bit sampling level signal and a digital signal as their respective internal signals.

To do evaluation or debugging on the LSI 16, these internal signals need to be monitored. For that purpose, in the conventional LSI 16, a command to monitor the phase error signal may be externally input to the system controller 13 by way of the interface 15. Then, in accordance with this command, the system controller 13 specifies a value, defining how the selector 10e should operate, in the register 11. According to this setting defined and stored in the register 11, the selector 10e selects the phase error signal from the output signals of the PLL 10d and then outputs it to the monitor terminal 14. If the monitor signal is an 8-bit signal, then the monitor terminal 14 may actually consist of nine terminals including a clock output terminal, for example. In this manner, in the conventional LSI, the settings in the register 11 are defined such that internal information to be monitored outside of the signal processor 10 is output through the monitor terminals 14, and the monitor terminals 14 are subjected to test equipment, for example, thereby checking out the operability of the signal processor 10 and carrying out debugging and evaluation on the processor 10.

However, if those monitor terminals are provided, the number of overall terminals increases, thus raising the cost of the LSI unintentionally. To avoid such an unwanted situation, Japanese Laid-Open Publication No. 2001-228215 discloses a technique of minimizing the number of additional monitor terminals by subjecting a multi-bit monitor signal to parallel-to-serial conversion and then outputting the resultant monitor signal in series.

Nevertheless, even if the monitor signal is output in series, at least one terminal dedicated to monitoring is still required, thus increasing the cost of the LSI to a certain degree.

In addition, to convert the parallel data into serial data, the polarity inversion interval of the monitor terminal needs to be shorter than the situation where parallel data is output through a plurality of monitor terminals. In that case, the current flowing through the monitor terminal will change so frequently as to increase the noise of the LSI noticeably. Such noise may cause some malfunctions in an LSI that should operate at a sufficiently high rate. Accordingly, to allow such an LSI to operate constantly at a desired high rate, it is not preferable to provide those monitor terminals that should increase the noise.

Furthermore, if the monitor signal is output to monitor the internal states of the LSI, then the operation of the LSI might be affected by the noise caused by the monitor signal. That is to say, the operability of the LSI may not be checked out accurately only by the monitor signal.

SUMMARY OF THE INVENTION

In order to overcome the problems described above, preferred embodiments of the present invention provide an integrated circuit that allows the user to monitor its internal signals, an optical disc drive including such an integrated circuit, and a signal monitoring method.

An integrated circuit according to a preferred embodiment of the present invention preferably includes a signal processor, at least one memory, an interface, and a controller. The signal processor preferably receives an input signal and generates a processed signal and at least one type of internal signal. The processed signal preferably represents processing information obtained by subjecting the input signal to predetermined processing. The internal signal preferably includes internal information obtained while the processor is performing the processing. The memory preferably stores the processing information represented by the processed signal. The interface preferably exchanges signals with an external device. The controller preferably controls the signal processor, the memory and the interface. On receiving a first instruction from the external device by way of the interface, the controller preferably controls the signal processor and the memory such that the processing information, represented by the processed signal being output from the signal processor, is once stored in the memory and then output to the external device via the interface. On receiving a second instruction from the external device by way of the interface, the controller preferably controls the signal processor and the memory such that the internal information, represented by the internal signal being generated by the signal processor, is once stored in the memory and then output to the external device via the interface.

In one preferred embodiment of the present invention, the signal processor preferably generates multiple types of internal signals including the at least one type of internal signal.

In another preferred embodiment, the integrated circuit preferably further includes a bus that connects the signal processor and the memory together. On receiving the second instruction from the external device, the controller preferably transfers either the at least one type of internal signal or the multiple types of internal signals from the signal processor to the memory directly through the bus.

In an alternative preferred embodiment, on receiving the second instruction from the external device, the controller may receive the multiple types of internal signals in parallel from the signal processor and may transfer the multiple types of internal signals in parallel to the memory, thereby storing multiple types of internal information in the memory.

In still another preferred embodiment, the signal processor preferably includes a selector for selecting one of the multiple types of internal signals under the control of the controller.

In yet another preferred embodiment, the at least one memory may include a first memory and a second memory, the first memory may store the processing information, and the second memory may store the internal information.

In an alternative preferred embodiment, the at least one memory may include one memory, which selectively stores either the processing information or the internal information in accordance with the first or second instruction.

In yet another preferred embodiment, the integrated circuit may further include a register for temporarily storing the internal information. In that case, the internal information, represented by the internal signal that has been generated by the signal processor, is preferably sequentially stored in the register and then transferred to the memory.

In this particular preferred embodiment, the internal information stored in the register is preferably updated at an interval that is sufficiently longer than one period of an operating clock signal for the controller.

More specifically, the memory is preferably a DRAM and the register is preferably an SRAM.

In yet another preferred embodiment, the signal processor preferably includes an analog-to-digital converter, a Viterbi decoder, a PLL and a demodulator, and the internal signals preferably include a phase error signal, a frequency error signal, a multi-bit sampling level signal and a digital signal.

An optical disc drive according to a preferred embodiment of the present invention preferably includes a drive motor, a pickup, and the integrated circuit according to any of the preferred embodiments of the present invention described above. The drive motor preferably rotates an optical disc on which information is stored. The pickup preferably irradiates the optical disc with light, receives the light that has been reflected from the optical disc, and outputs a read signal with a signal level changing according to an arrangement pattern of marks or pits on the optical disc. The integrated circuit preferably receives the read signal as an input signal and outputs a demodulated signal.

A signal monitoring method according to a preferred embodiment of the present invention is a method for monitoring an internal signal of an integrated circuit. The integrated circuit preferably includes a signal processor, at least one memory, an interface and a controller. The signal processor preferably receives an input signal and generates a processed signal and at least one type of internal signal. The processed signal preferably represents processing information obtained by subjecting the input signal to predetermined processing. The internal signal preferably includes internal information obtained while the processor is performing the processing. The memory preferably stores the processing information represented by the processed signal. The interface preferably exchanges signals with an external device. The controller preferably controls the signal processor, the memory and the interface. The internal information, obtained by the signal processor, is preferably once stored in the memory and then output to the external device via the interface.

A signal processing method according to another preferred embodiment of the present invention preferably includes the step of receiving an input signal and generating a processed signal and at least one type of internal signal. The processed signal preferably represents processing information obtained by subjecting the input signal to predetermined processing. The internal signal preferably includes internal information obtained while the predetermined processing is being performed. The method preferably further includes the step of storing, in response to a first instruction received from an external device by way of an interface, the processing information in a memory and then outputting the processing information from the memory to the external device via the interface, or storing, in response to a second instruction received from the external device by way of the interface, the internal information in the memory and then outputting the internal information from the memory to the external device via the interface.

According to various preferred embodiments of the present invention described above, an internal signal of an integrated circuit can be monitored, and debugging and evaluation both can be done on the integrated circuit, even without providing any dedicated monitor terminal for the integrated circuit. Also, since no signals are output through any monitor terminal, the internal signal never makes noise that affects the operation of the integrated circuit. Furthermore, by omitting the monitor terminals, the manufacturing cost and overall dimensions of the integrated circuit can be both reduced, too.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 1 is a block diagram showing a configuration for a conventional LSI.

FIG. 2 is a block diagram showing a detailed configuration for the signal processor in the conventional LSI shown in FIG. 1.

DETAILED DESCRIPTION OF PREFERRED EMBODIMENTS

Embodiment 1

Figure 3:
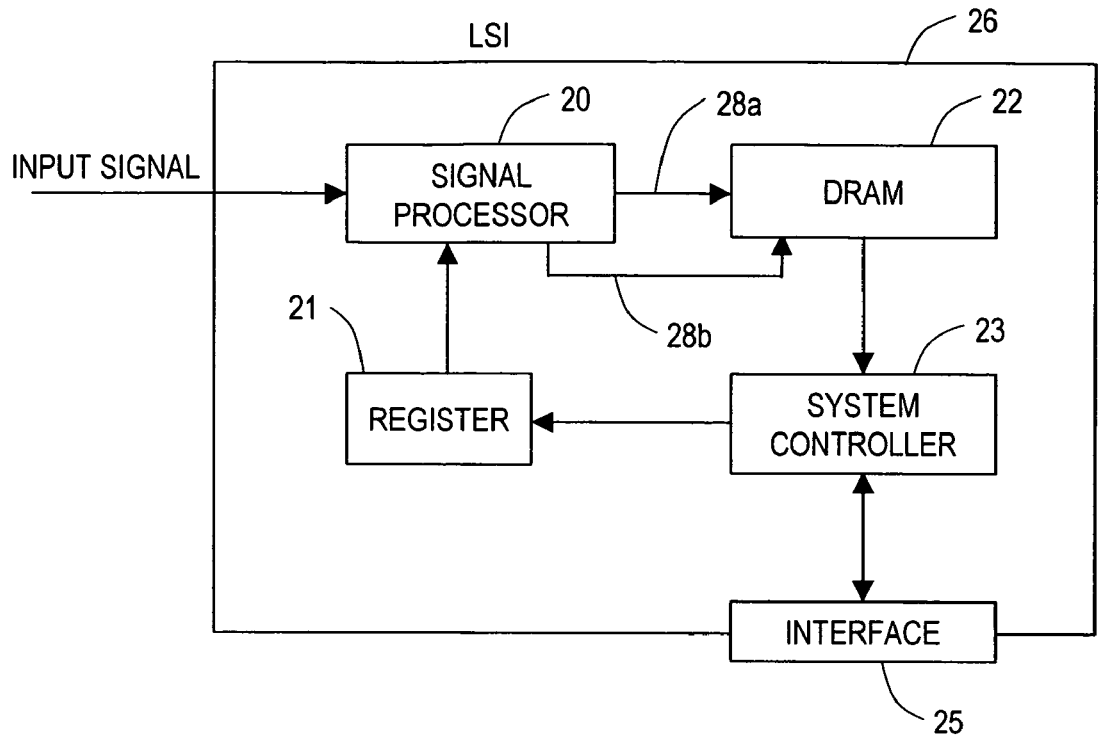
FIG. 3 is a block diagram showing an integrated circuit according to a first specific preferred embodiment of the present invention.

FIG. 3 is a block diagram showing an integrated circuit (which will be referred to herein as an "LSI") according to a first specific preferred embodiment of the present invention. As shown in FIG. 3, the LSI 26 preferably includes a signal processor 20, a register 21, a DRAM 22 as at least one memory, a system controller 23, and an interface 25 with multiple terminals. All of these components of the LSI 26 are packaged together with a resin, for example, thereby making a single chip. Also, those terminals of the interface 25 preferably extend out of the package.

The signal processor 20 preferably receives an input signal and generates a processed signal, representing processing information, by subjecting the input signal to predetermined processing. The signal processor 20 also generates an internal signal including internal information obtained while performing the processing. The contents of the processing to be carried out by the signal processor 20 are preferably determined by settings, which are specified by the system controller 23 for the register 21. A signal, indicating whether the processed signal, obtained by the predetermined processing, or the internal signal should be output from the signal processor 20 to the DRAM 22, is also stored in the register 21. The register 21 preferably operates at a sufficiently high rate and is preferably an SRAM, for example.

The DRAM 22 preferably receives the processed signal, which has been subjected to the predetermined processing, from the signal processor 20 by way of a first bus 28a and the internal signal from the signal processor 20 by way of a second bus 28b, respectively. The DRAM 22 preferably has a memory area to store both the processing information represented by the received processed signal and internal information represented by the received internal signal.

In response to a request received from an external device, the interface 25 preferably exchanges signals with the external device. On receiving a first instruction from the external device by way of the interface 25, the system controller 23 preferably specifies a value in the register 21 such that the signal processor 20 outputs the processed signal. Then, the DRAM 22 preferably receives the processed signals one after another from the signal processor 20 by way of the first bus 28a and then sequentially stores the processing information, represented by the processed signals, on its memory area. Meanwhile, the system controller 23 preferably reads out the processing information from the DRAM 22 and then outputs a signal, including the processing information, to the external device through a terminal of the interface 25.

On the other hand, on receiving a second instruction from the external device by way of the interface 25, the system controller 23 preferably specifies a value in the register 21 such that the signal processor 20 outputs the internal signal. Then, the DRAM 22 preferably receives the internal signals one after another from the signal processor 20 by way of the second bus 28b and then sequentially stores the internal information, represented by the internal signals, on its memory area at regular intervals. Meanwhile, the system controller 23 preferably reads out the internal information from the DRAM 22 and then outputs a signal, including the internal information, to the external device through a terminal of the interface 25.

It should be noted that the timing at which the internal signal is output from the signal processor 20 needs to be synchronous with the timing at which the DRAM 22 receives the signal. For that purpose, although not shown in FIG. 3, the signal processor 20 preferably includes a register for temporarily storing the internal information represented by the internal signal and the internal information stored in the register is preferably updated synchronously with the application of an operating clock pulse to the DRAM 22. Optionally, that register may be provided separately from the signal processor 20. Also, the interval at which the internal information is updated is preferably sufficiently longer than one period of the operating clock pulse applied to the system controller 23. Then, the internal signal can be monitored properly without missing any part of the internal information.

In this LSI 26, the internal signal, which has been output from the signal processor 20 with the internal information, is preferably temporarily stored in the DRAM 22 and then output to the external device outside of the LSI 26 by way of the system controller 23 and interface 25. Accordingly, even though no dedicated internal information monitor terminal is provided for this LSI 26 unlike the conventional one, any desired internal information of the signal processor 20 can still be monitored and operability check, debugging, evaluation and so on can also be carried out on the signal processor 20. Furthermore, the internal information is once stored in the DRAM 22. Thus, the internal information can be transferred to the DRAM 22 at the same rate as the operating clock rate of the signal processor 20 or DRAM 22 without being limited by the maximum transfer rate of the interface 25. That is to say, the internal information can be checked out in further detail. In addition, the internal information, as well as the processing information, is preferably output through the interface 25. Accordingly, no malfunctions of the LSI 26 will be caused by any signal representing the internal information and making noise.

Furthermore, since the internal information is stored in the DRAM 22, there is no need to provide any additional memory to monitor the internal signal. Thus, neither the manufacturing cost of the LSI 26 nor the chip size will increase for the purpose of monitoring.

Moreover, the internal information can be retrieved to a host computer, which is connected as the external device to this LSI 26, by way of the interface 25 and can be displayed on the host computer by graphs, numerals or any other suitable method. Thus, the internal information can be monitored without using any dedicated test equipment such as a logic analyzer. Consequently, not only the manufacturing cost of the LSI itself but also that of a system for performing evaluation, analysis and debugging on the LSI can be reduced.

Generally speaking, as long as a given LSI is operating normally, there is often no need to check out any internal information of that LSI. In that case, no monitor terminals of the conventional LSI are used. Even so, the presence of those monitor terminals increases the total number of terminals of the LSI and the overall package size, thus constituting an obstacle to downsizing the LSI. However, the LSI according to this preferred embodiment of the present invention includes no monitor terminals, and therefore, can overcome those problems and can contribute to downsizing the LSI.

It should be noted that two or more types of internal signals may be generated by the signal processor 20. In that case, one of the two or more types of internal signals may be selectively output to the DRAM 22 according to the value specified in the register 21. Alternatively, the width of the second bus 28b may be adjusted so as to output two or more types of internal signals at the same time.

In the preferred embodiment described above, the second bus 28b for transmitting the internal signal is provided separately from the first bus 28a for transmitting the processed signal. However, the internal and processed signals may be both transmitted through the same bus.

Figure 4:
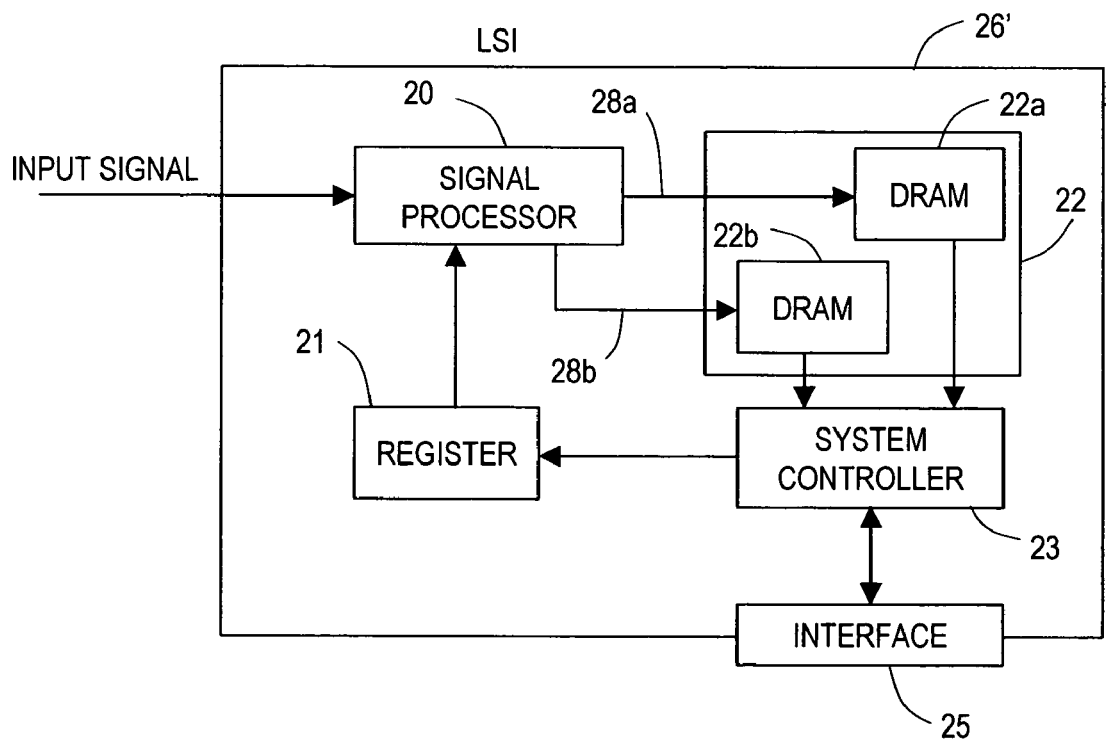
FIG. 4 is a block diagram showing another integrated circuit according to the first preferred embodiment.

In an alternative preferred embodiment, a memory for storing the processing information and a memory for storing the internal information may be provided separately as shown in FIG. 4. The LSI 26' shown in FIG. 4 preferably includes a memory set 22' including a first memory 22a and a second memory 22b. The first and second memories 22a and 22b are preferably independent of each other and can be accessed in parallel.

In this LSI 26', the processed signal is preferably output from the signal processor 20 to the first memory 22a by way of the first bus 28a, while the internal signal is preferably output from the signal processor 20 to the second memory 22b by way of the second bus 28b. The processing information and internal information are preferably stored in the first and second memories 22a and 22b, respectively. In accordance with a second instruction externally received through the interface 25, the system controller 23 preferably retrieves the internal information from the second memory 22b and outputs it to the external device by way of a terminal of the interface 25. Also, in accordance with a first instruction externally received through the interface 25, the system controller 23 preferably retrieves the processing information from the first memory 22a and outputs it to the external device by way of a terminal of the interface 25. In this manner, the internal information can be monitored without interfering with the normal operation of the LSI 26 (i.e., the operation of the signal processor) at all. In addition, the internal information and processing information can be obtained at the same time. Thus, the operability of the signal processor can be checked out in further detail by monitoring the internal information while considering the processing information obtained.

Figure 5:
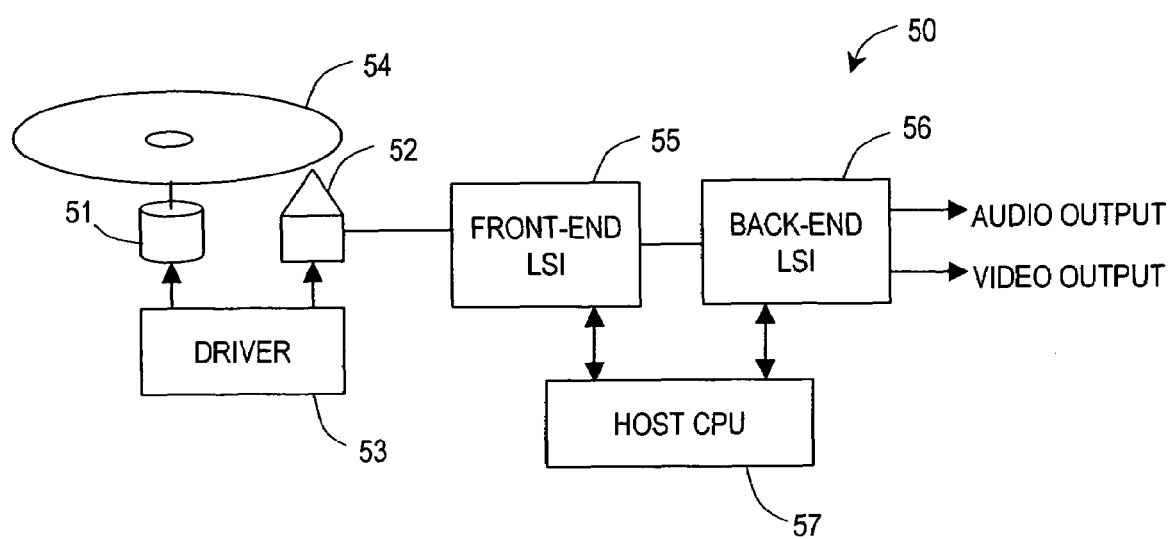
FIG. 5 is a block diagram showing an optical disc drive according to the first preferred embodiment.

Hereinafter, an application of this preferred embodiment to an optical disc drive will be described. FIG. 5 is a block diagram showing an optical disc drive 50 according to this preferred embodiment. The optical disc drive 50 preferably includes a spindle motor 51, a pickup 52, a driver 53, a front-end LSI 55, a back-end LSI 56 and a host CPU 57. The spindle motor 51 preferably rotates and drives an optical disc 54, on which information is stored, under the control of the driver 53. The pickup 52 preferably emits light toward the optical disc 54. On the optical disc 54, pits or marks representing some information are preferably arranged along the tracks. The pickup 52 is preferably controlled by the driver 53 so as to focus the light right on the optical disc 54 while following target tracks thereon. Also, the pickup 52 preferably receives and detects the light that has been reflected from the optical disc 54 and converts the detected light into an electric signal, thereby outputting an analog read signal, of which the level changes with the information stored or the tracking error.

The front-end LSI 55 preferably receives the analog read signal from the pickup 52, converts it into a digital signal, and then subjects it to demodulation, error correction and other types of processing, thereby outputting a digital read signal including the information that has been stored on, and has just been read out from, the optical disc. The back-end LSI 56 preferably includes an MPEG decoder, for example, and processes the information included in the digital read signal according to its intended application. For example, the back-end LSI 56 may split the digital read signal into an audio signal and a video signal and then output them separately. The host CPU 57 preferably controls the front-end LSI 55 and back-end LSI 56.

Figure 6:
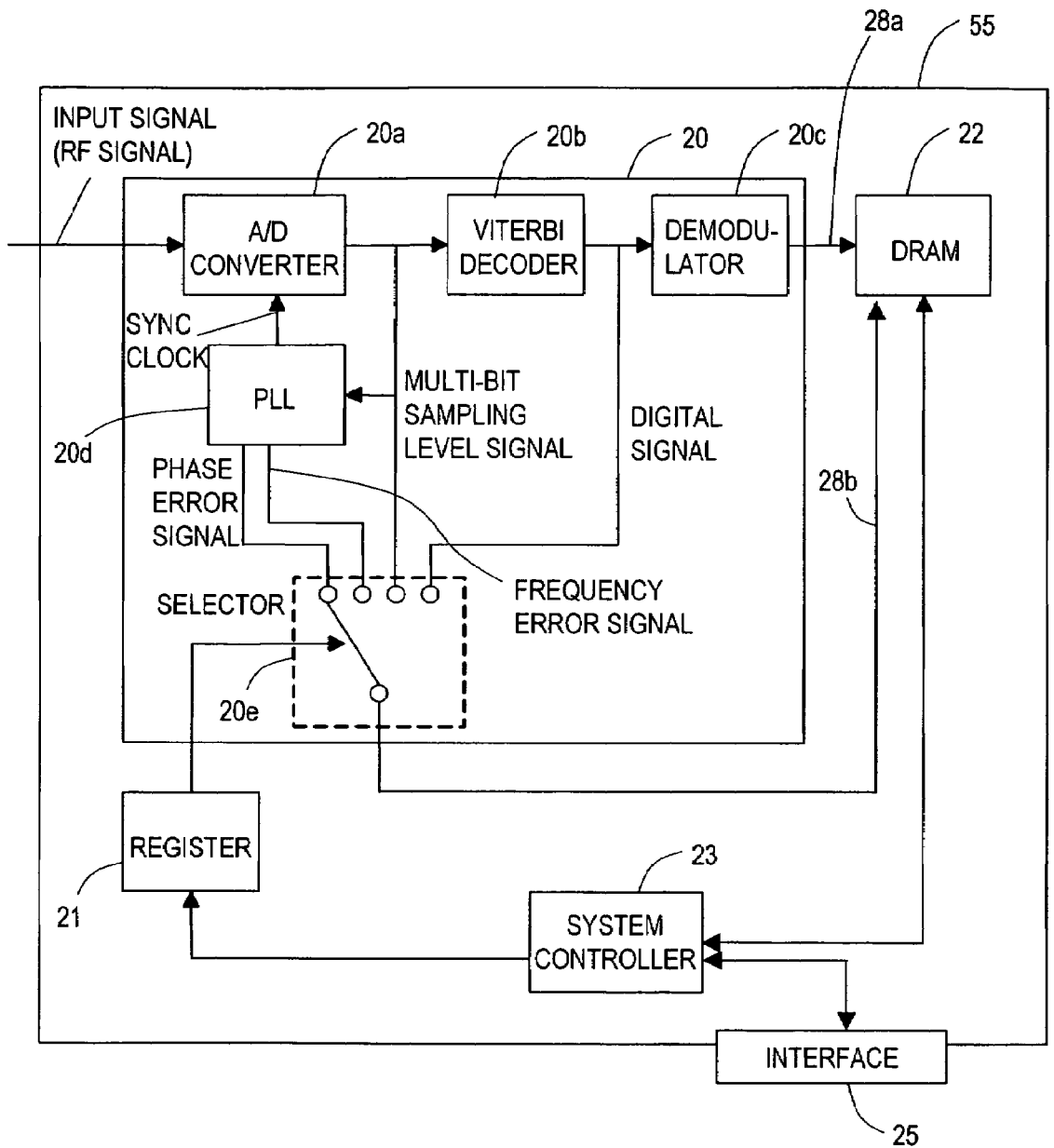
FIG. 6 is a block diagram showing a detailed configuration for the integrated circuit shown in FIG. 4.

FIG. 6 is a block diagram showing a configuration for the front-end LSI 55. The front-end LSI 55 preferably has the same configuration as the LSI 26 shown in FIG. 3. Specifically, the front-end LSI 55 preferably includes a signal processor 20, a register 21, a DRAM 22, a system controller 23, and an interface 25. The signal processor 20 preferably includes an A/D converter 20a, a Viterbi decoder 20b, a demodulator 20c, a PLL 20d and a selector 20e.

The input analog read signal is preferably converted by the A/D converter 20a of the signal processor 20 into a multi-bit sampling level signal. At the same time, the PLL 20d preferably generates a sync clock signal synchronously with the multi-bit sampling level signal. The Viterbi decoder 20b preferably receives the multi-bit sampling level signal from the A/D converter 20a and subjects it to a partial response maximum likelihood (PRML) process, thereby converting the sampling level signal into a digital signal. Then, the demodulator 20c subjects the digital signal to error correction and data demodulation processes, thereby obtaining a digital read signal including address information, user data and other information that has been read out.

In generating the sync clock signal, the PLL 20d preferably estimates a phase error and a frequency error between the multi-bit sampling level signal and sync clock signal, thereby generating, as respective internal signals, a phase error signal including phase error information and a frequency error signal including frequency error information. The multi-bit sampling level signal and digital signal are also important internal signals, which can be used as indices to evaluate the processing performance of the signal processor 20. The selector 20e preferably selects one of these internal signals and outputs the selected signal to the DRAM 22 by way of a bus 28b. For example, if a value "1" is set on the register 21, then the phase error signal is selectively output. Three other values "2", "3" and "4" are preferably respectively associated with the frequency error signal, multi-bit sampling level signal and digital signal to be selectively output. However, if a value "0" is specified on the register 21, then none of those internal signals will be output to the DRAM 22.

For example, supposing an instruction to monitor the multi-bit sampling level signal has been input to the system controller 23 from an external device by way of the interface 25, the system controller 23 preferably specifies a value "3" on the register 21. Then, in accordance with this setting specified on the register 21, the selector 20e preferably selects the multi-bit sampling level signal as the internal signal. Every time this interrupt occurs, the system controller 23 preferably outputs the multi-bit sampling level signal to the DRAM 22 by way of the bus 28b. The multi-bit sampling level signal may be output either a predetermined number of times as defined by the external instruction or any number of times until an instruction to stop monitoring that signal is input from the external device. As a result, multi-bit sampling level information is stored in the DRAM 22. When the multi-bit sampling level information is acquired in this manner, the system controller 23 preferably retrieves the multi-bit sampling level information from the DRAM 22 and outputs it to the external device by way of a terminal of the interface 25.

For example, supposing the optical disc is a DVD and multi-bit sampling information of 7 bits needs to be monitored, the multi-bit sampling level is preferably updated at an interval that is as long as one period of an operating clock pulse for the signal processor 20. In that case, according to a conventional method, signals are output at a rate of several tens of MHz to several hundreds of MHz through eight monitor terminals (i.e., corresponding to data of 7 bits and a clock signal of 1 bit). In another conventional method of outputting monitor information through a reduced number of monitor terminals by utilizing the parallel-to-serial conversion, the signals need to be output at as high a rate as several hundreds of MHz to even more than 1 GHz. In such a situation, the effects of noise are far from being negligible. In contrast, in the LSI of this preferred embodiment, the internal information is preferably temporarily stored in the DRAM and then output through an interface terminal as well as the processing information. Thus, the multi-bit sampling level can be monitored without being affected by any noise.

Embodiment 2

Figure 7:
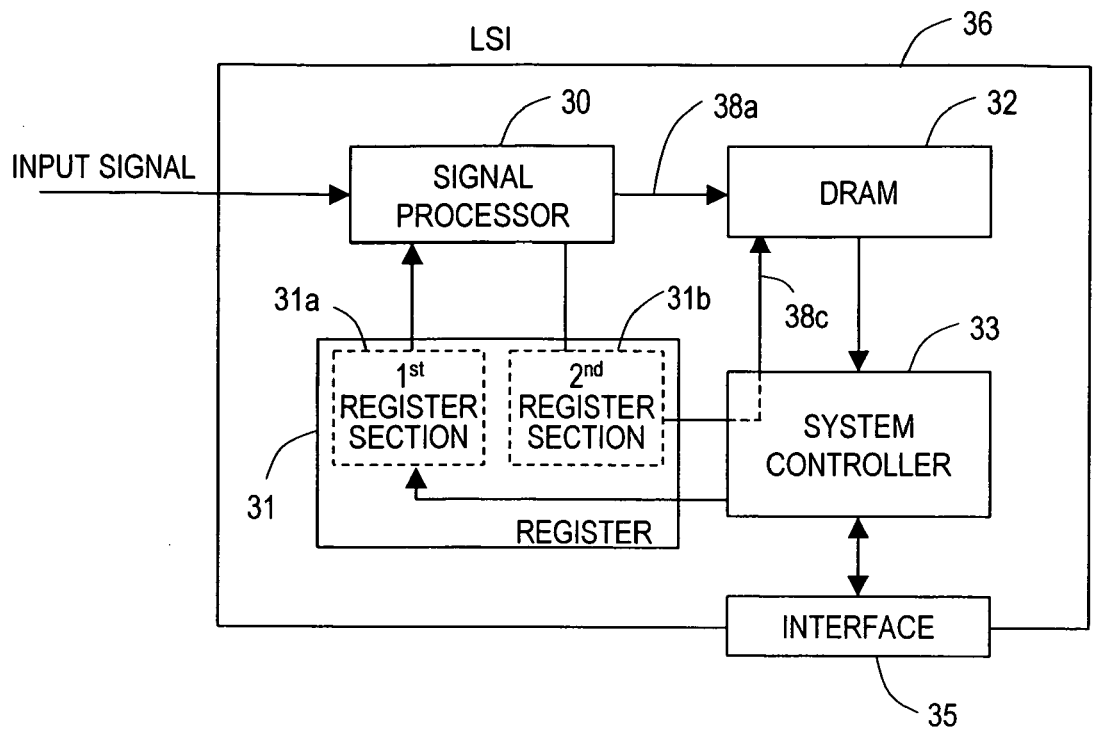
FIG. 7 is a block diagram showing an integrated circuit according to a second specific preferred embodiment of the present invention.

FIG. 7 is a block diagram showing an LSI according to a second specific preferred embodiment of the present invention. As shown in FIG. 7, the LSI 36 preferably includes a signal processor 30, a register 31, a DRAM 32 as at least one memory, a system controller 33 and an interface 35 with multiple terminals. Each of the signal processor 30, DRAM 32 and interface 35 preferably has the same configuration as the counterpart of the first preferred embodiment described above.

In this second preferred embodiment, the internal signal generated by the signal processor 30 is preferably temporarily stored in the register 31 and then transferred to the DRAM 32 by way of the system controller 33. More specifically, the register 31 preferably includes a first register section 31a, on which a value defining the contents of processing to be performed by the signal processor 30 is specified, and a second register section 31b, in which the internal signal is stored temporarily. The internal signal generated by the signal processor 30 is preferably transferred to, and temporarily stored in, the second register section 31b of the register 31 through a bus 38c. Thereafter, the internal information stored is preferably sequentially transferred to, and stored in, the DRAM 32 by way of the bus 38c and system controller 32.

Either a single type of internal information or multiple types of internal information may be stored in the second register section 31b. If the number of different types of internal information that can be stored in the second register section 31b is smaller than the number of different types of internal information generated by the signal processor 30, then the signal processor 30 is preferably provided with a selector. In that case, the selector may be operated according to the value specified on the first register section 31a so as to selectively store some of the internal information on the second register section 31b. Alternatively, all internal information may be temporarily stored in the second register section 31b and then just a part of the internal information, selected by a selector, for example, may be stored in the DRAM 32. In any case, if multiple different types of internal information is stored in the DRAM 32, then multiple internal signals can be monitored at the same time.

On receiving a first instruction from an external device by way of the interface 35, the system controller 33 preferably specifies a value in the first register section 31a of the register 31 such that the signal processor 30 outputs the processed signal. Then, the DRAM 32 preferably receives the processed signals one after another from the signal processor 30 by way of a bus 38a and then sequentially stores the processing information, represented by the processed signals, on its memory area. Meanwhile, the system controller 33 preferably reads out the processing information from the DRAM 32 and then outputs a signal, including the processing information, to the external device through a terminal of the interface 35.

On the other hand, on receiving a second instruction from the external device by way of the interface 35, the system controller 33 preferably specifies a value in the first register section 31a of the register 31 such that the signal processor 30 outputs the internal signal. Then, the signal processor 30 preferably outputs the internal signals one after another to the second register section 31b by way of the bus 38c and then sequentially stores the internal information thereon. Meanwhile, the system controller 33 preferably reads out the internal information sequentially from the second register section 31b at predetermined intervals and then stores it on the DRAM 32 by way of the bus 38c. Furthermore, the system controller 33 preferably reads out the internal information from the DRAM 32 and outputs a signal, including the internal information, to the external device through a terminal of the interface 35.

If the signal processor 30 and system controller 33 operate responsive to mutually different clock signals, then the internal information stored in the second register section 31b is preferably updated at an interval that is sufficiently longer then one period of the operating clock signal of the system controller 33 so as to allow the system controller 33 to read out the internal information accurately. Also, the interval at which the system controller 33 transfers the internal information from the register 31 to the DRAM 32 is preferably approximately equal to, or longer than, the interval at which the internal information stored in the second register section 31b is updated such that the same monitor information will not be transferred a number of times.

Also, the system controller 33 may transfer the internal information from the register 31 to the DRAM 32 either at regular intervals or whenever the signal processor 30 detects some characteristic pattern (e.g., a pattern of a sync signal) from the input signal. For example, in monitoring internal information to be updated every time the sync signal is detected, the internal information may be transferred from the register 31 to the DRAM 32 whenever the sync signal is detected. Then, the DRAM 32 can be made full use of.

Figure 8:
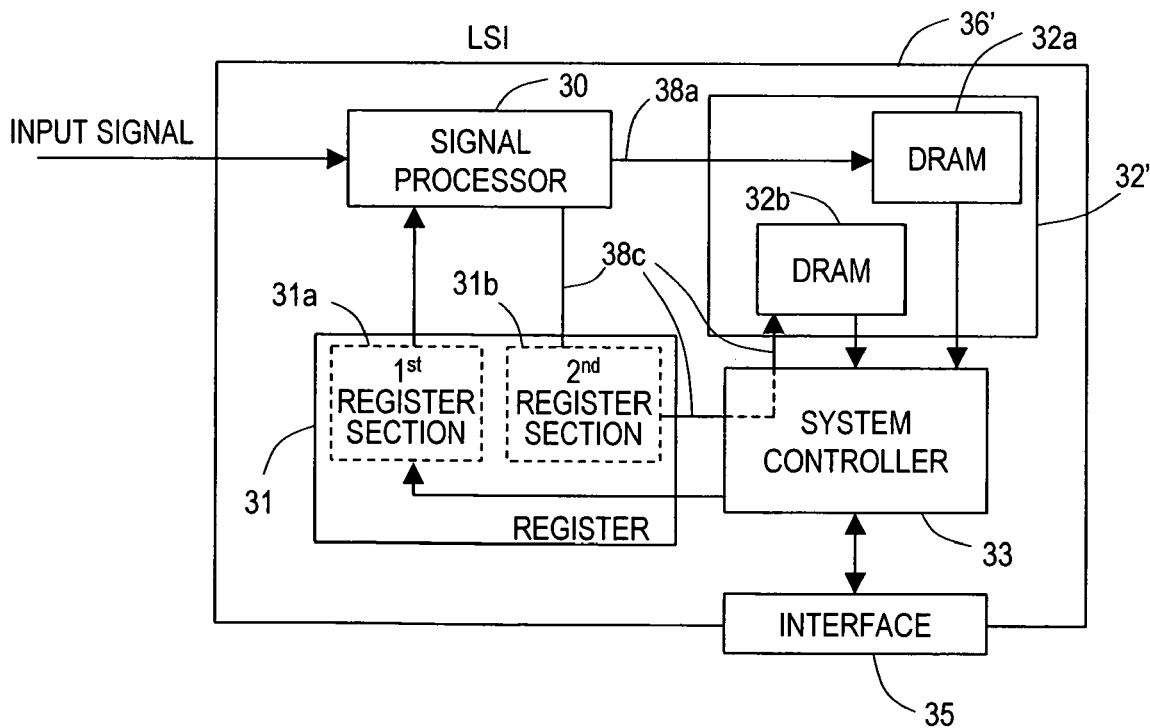
FIG. 8 is a block diagram showing another integrated circuit according to the second preferred embodiment.

In an alternative preferred embodiment, a memory for storing the processing information and a memory for storing the internal information may be provided separately as shown in FIG. 8. The LSI 36' shown in FIG. 8 preferably includes a memory set 32' including a first memory 32a and a second memory 32b. The first and second memories 32a and 32b are preferably independent of each other and can be accessed in parallel.

In this LSI 36', the processed signal is preferably output from the signal processor 30 to the first memory 32a by way of the first bus 38a, while the internal signal is preferably output from the signal processor 30 to the second memory 32b by way of the second bus 38c and system controller 33. The processing information and internal information are preferably stored in the first and second memories 32a and 32b, respectively. In accordance with a second instruction externally received through the interface 35, the system controller 33 preferably retrieves the internal information from the second memory 32b and outputs it to the external device by way of a terminal of the interface 35. Also, in accordance with a first instruction externally received through the interface 35, the system controller 33 preferably retrieves the processing information from the first memory 32a and outputs it to the external device by way of a terminal of the interface 35. In this manner, the internal information can be monitored without interfering with the normal operation of the LSI 36' (i.e., the operation of the signal processor) at all. In addition, the internal information and processing information can be obtained at the same time. Thus, the operability of the signal processor can be checked out in further detail by monitoring the internal information while considering the processing information obtained.

Consequently, the LSI 36 of this second preferred embodiment, as well as the counterpart of the first preferred embodiment described above, can also monitor any desired internal information of the signal processor 30 without using any monitor terminal.

Figure 9:
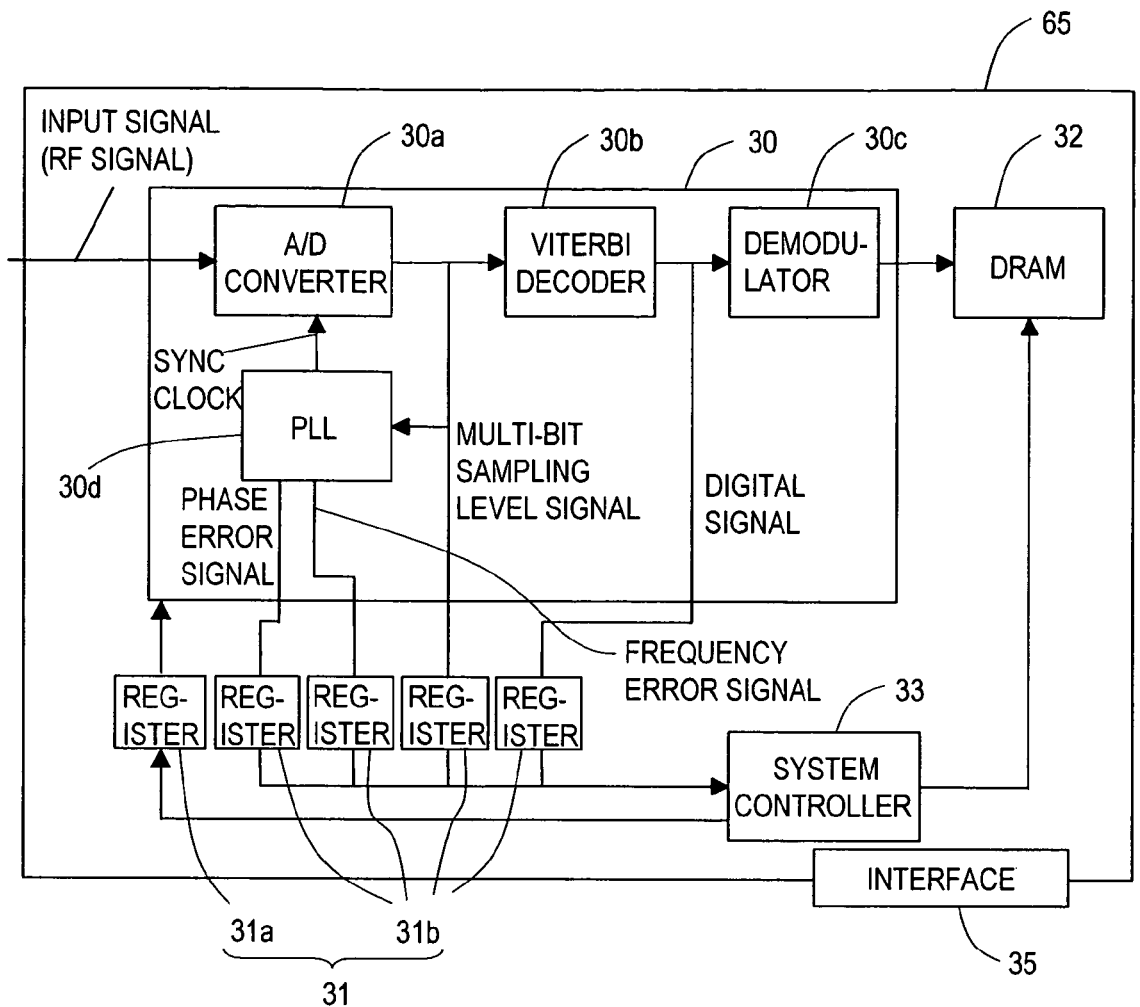
FIG. 9 is a block diagram showing a detailed configuration for the integrated circuit shown in FIG. 7.

FIG. 9 is a block diagram showing an example in which this preferred embodiment is applied to a front-end LSI 65 for an optical disc drive. This front-end LSI 65 can be used effectively in place of the front-end LSI 55 in the optical disc drive shown in FIG. 5. As shown in FIG. 9, the front-end LSI 65 preferably includes a signal processor 30, a register 31, a DRAM 32, a system controller 33, and an interface 35. As in the first preferred embodiment described above, the signal processor 30 preferably includes an A/D converter 30a, a Viterbi decoder 30b, a demodulator 30c and a PLL 30d.

As in the first preferred embodiment described above, the signal processor 30 preferably generates a phase error signal representing a phase error between the sync clock signal and multi-bit sampling level signal and a frequency error signal representing a frequency error between the sync clock signal and multi-bit sampling level signal as respective internal signals. The signal processor 30 preferably further generates the multi-bit sampling level signal and a digital signal.

The register 31 preferably includes a first register section 31a specifying a mode of operation of the signal processor and a second register section 31b for temporarily storing the phase error signal, frequency error signal, multi-bit sampling level signal and digital signal.

For example, supposing an instruction to monitor the phase error signal and digital signal has been input to the system controller 33 from an external device by way of the interface 35, the system controller 33 preferably specifies a predetermined value on the first register section 31a so that no read information is output to the DRAM 32. Then, every time this interrupt occurs, the system controller 33 preferably reads out the phase error information and digital information from the second register section 31b simultaneously and then outputs them to the DRAM 32. The phase error information and digital information may be output either a predetermined number of times as defined by the external instruction or any number of times until an instruction to stop monitoring those signals is input from the external device. As a result, the phase error information and digital information are stored in the DRAM 32. When the phase error information and digital information are acquired in this manner, the system controller 33 preferably retrieves the phase error information and digital information from the DRAM 32 and outputs them to the external device by way of a terminal of the interface 35.

In this manner, according to the preferred embodiment described above, the phase error information and digital information, which have been acquired simultaneously, can be monitored. Thus, it is possible to determine whether an error has been caused in the digital information by a phase error or any other error, for example. Alternatively, frequency error information and multi-bit sampling level information may also be acquired simultaneously and stored in the DRAM 32. Then, the operability of the signal processor 30 can be checked out in further detail.

In the first and second preferred embodiments, the present invention has been described as being applied to a front-end LSI for use in an optical disc drive. However, the present invention is also effectively applicable for use in various other types of LSIs such as signal process LSI employed in hard disk drives, digital broadcast systems, or the like. Also, the input signal of the LSI does not have to be an analog signal but may be a digital signal, too.

Furthermore, the internal information to be monitored by the signal processor of the front-end LSI does not have to be the phase error information, frequency error information, multi-bit sampling level information or digital information but may be any other type of information. For example, information representing how address information has been detected from the read information may be monitored. In that case, the address information detected is preferably updated every time an address sync signal is detected. Accordingly, if the information representing the address information detecting state is transferred from the register 31 to the DRAM 32 every time the address sync signal is detected, then the DRAM 32 can be made full use of and long-term address detecting state can be monitored accurately.

The present invention can be used in various types of LSIs of which the internal signals need monitoring.

This application is based on Japanese Patent Applications No. 2003-106389 filed on Apr. 10, 2003 and No. 2004-098854 filed on Mar. 30, 2004, the entire contents of which are hereby incorporated by reference.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An integrated circuit comprising:
    a signal processor, which receives an input signal and generates a processed signal and at least one type of internal signal, the processed signal representing processing information obtained by subjecting the input signal to predetermined processing, the internal signal including internal information obtained while the processor is performing the processing;
    at least one memory to store the processing information represented by the processed signal;
    an interface for exchanging signals with an external device; and
    a controller for controlling the signal processor, the memory and the interface,
    wherein on receiving a first instruction from the external device by way of the interface, the controller controls the signal processor and the memory such that the processing information, represented by the processed signal being output from the signal processor, is once stored in the memory and then output to the external device via the interface, wherein on receiving a second instruction from the external device by way of the interface, the controller controls the signal processor and the memory such that the internal information, represented by the internal signal being generated by the signal processor, is once stored in the memory and then output to the external device via the interface, and wherein the signal processor includes an analog-to-digital converter, a Viterbi decoder, a PLL, and a demodulator, and wherein the input signal is an analog signal, and the internal signal is generated based on a signal converted from the input signal by the analog-to-digital converter and includes a phase error signal, a frequency error signal, a multi-bit sampling level signal, and a digital signal.

2. The integrated circuit of claim 1, wherein the signal processor generates multiple types of internal signals including the at least one type of internal signal.

3. The integrated circuit of claim 1, further comprising a bus that connects the signal processor and the memory together, wherein on receiving the second instruction from the external device, the controller transfers either the at least one type of internal signal from the signal processor to the memory directly through the bus.

4. The integrated circuit of claim 2, wherein on receiving the second instruction from the external device, the controller receives the multiple types of internal signals in parallel from the signal processor and transfers the multiple types of internal signals in parallel to the memory, thereby storing multiple types of internal information in the memory.

5. The integrated circuit of claim 2, wherein the signal processor includes a selector for selecting one of the multiple types of internal signals under the control of the controller.

6. The integrated circuit of claim 1, wherein the at least one memory includes a first memory and a second memory, the first memory storing the processing information, the second memory storing the internal information.

7. The integrated circuit of claim 1, wherein the at least one memory includes one memory, which selectively stores either the processing information or the internal information in accordance with the first or second instruction.

8. The integrated circuit of claim 1, further comprising a register for temporarily storing the internal information, wherein the internal information, represented by the internal signal that has been generated by the signal processor, is sequentially stored in the register and then transferred to the memory.

9. The integrated circuit of claim 8, wherein the internal information stored in the register is updated at an interval that is sufficiently longer than one period of an operating clock signal for the controller.

10. The integrated circuit of claim 9, wherein the memory is a DRAM and the register is an SRAM.

11. An optical disc drive comprising:
a drive motor for rotating an optical disc on which information is stored;
a pickup, which irradiates the optical disc with light, receives the light that has been reflected from the optical disc, and outputs a read signal with a signal level changing according to an arrangement pattern of marks or pits on the optical disc; and
the integrated circuit of claim 1, which receives the read signal as an input signal and outputs a demodulated signal.

12. A method for monitoring an internal signal of an integrated circuit, the integrated circuit including a signal processor, at least one memory, an interface and a controller, the signal processor receiving an input signal and generating a processed signal and at least one type of internal signal, the processed signal representing processing information obtained by subjecting the input signal to predetermined processing, the internal signal including internal information obtained while the processor is performing the processing, the memory storing the processing information, the interface exchanging signals with an external device, the controller controlling the signal processor, the memory and the interface, wherein the signal processor includes an analog-to-digital converter, a Viterbi decoder, a PLL, and a demodulator, the input signal is an analog signal, and the internal signal is generated based on a signal converted from the input signal by the analog-to-digital converter and includes a phase error signal, a frequency error signal, a multi-bit sampling level signal, and a digital signal, wherein the processing information is once stored in the memory and then output to the external device via the interface in response to a first instruction, and wherein the internal information, obtained by the signal processor, is once stored in the memory and then output to the external device via the interface in response to a second instruction.

13. A signal processing method comprising the steps of:
receiving an input signal and generating a processed signal and at least one type of internal signal, the processed signal representing processing information obtained by subjecting the input signal to predetermined processing, the internal signal including internal information obtained while the predetermined processing is being performed; and
storing, in response to a first instruction received from an external device by way of an interface, the processing information in a memory and then outputting the processing information from the memory to the external device via the interface, and storing, in response to a second instruction received from the external device by way of the interface, the internal information in the memory and then outputting the internal information from the memory to the external device via the interface, wherein the signal processor includes an analog-to-digital converter, a Viterbi decoder, a PLL, and a demodulator, the input signal is an analog signal, and the internal signal is generated based on a signal converted from the input signal by the analog-to-digital converter and includes a phase error signal, a frequency error signal, a multi-bit sampling level signal, and a digital signal.

* * * * *

UNITED STATES PATENT AND TRADEMARK OFFICE
CERTIFICATE OF CORRECTION

PATENT NO. : 7,584,315 B2  Page 1 of 1
APPLICATION NO. : 10/818568
DATED : September 1, 2009
INVENTOR(S) : Kimura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1542 days.

Signed and Sealed this

Fourteenth Day of September, 2010

David J. Kappos
*Director of the United States Patent and Trademark Office*